United States Patent
Selvin et al.

(12) United States Patent (10) Patent No.: US 6,778,450 B2
(45) Date of Patent: Aug. 17, 2004

(54) PROGRAMMABLE WEAK WRITE TEST MODE

(75) Inventors: Eric B. Selvin, San Jose, CA (US); Ali R. Farhang, Beaverton, OR (US); Douglas A. Guddat, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 10/141,805

(22) Filed: May 8, 2002

(65) Prior Publication Data

US 2003/0210593 A1 Nov. 13, 2003

(51) Int. Cl.[7] .............................................. G11C 7/00
(52) U.S. Cl. .................. 365/201; 365/154; 365/185.22; 365/189.09; 365/190; 365/230.06
(58) Field of Search ................................ 365/201, 154, 365/185.22, 189.09, 190, 230.06

(56) References Cited

U.S. PATENT DOCUMENTS

| | | | |
|---|---|---|---|
| 5,559,745 A | | 9/1996 | Banik et al. |
| 5,835,429 A | * | 11/1998 | Schwarz ..................... 365/201 |
| 6,192,001 B1 | * | 2/2001 | Weiss et al. ........... 365/230.06 |
| 6,256,241 B1 | | 7/2001 | Mehalel |
| 6,501,692 B1 | * | 12/2002 | Melanson et al. .......... 365/201 |
| 6,552,941 B2 | * | 4/2003 | Wong et al. ................ 365/201 |

* cited by examiner

Primary Examiner—Richard Elms
Assistant Examiner—Pho M. Luu
(74) Attorney, Agent, or Firm—Blakely, Sokoloff, Taylor & Zafman LLP (57) ABSTRACT

A new programmable weak write circuit is defined with the ability to perform SRAM weak write testing at multiple stress strength settings which track process variation. Prior art weak write test circuitry is designed to test a population of SRAM devices at a fixed weak write stress strength as determined by the best available pre-silicon design environmental factors. This design may over- or under-test SRAM cells for the target defects due to poor process tracking characteristics and may require multiple post-silicon design iterations to keep up with environmental changes following initial design. In the new circuit, multiple settings are designed in pre-silicon to account for the expected uncertainty in environmental factors. During post-silicon testing, a suitable stress setting is selected based on an acceptable or predetermined quality versus test yield tradeoff and its suitability is re-evaluated following any significant environmental changes to determine if a different stress setting is necessary.

26 Claims, 6 Drawing Sheets

PROGRAMMABLE WEAK WRITE TEST MODE

BACKGROUND OF THE INVENTION

1. Field of the Invention

The present invention relates to integrated circuit memory devices. In particular, the present invention relates to circuits for testing memory cells.

2. Background Information

A prior art static random access memory (SRAM) commonly includes an array of SRAM cells. Each SRAM cell is capable of storing data using a pair of cross-coupled devices, such as inverters. Pull-up gates in the cross-coupled devices usually prevent leakage currents in a SRAM cell from discharging the internal data storage nodes of the SRAM cell.

Defects sometimes occur during the manufacturing process that can impair the functionality of the SRAM cells. A symmetric defect impairs the performance of both cross-coupled devices of the SRAM cell equally. On the other hand, an asymmetric defect normally impairs only one of the cross-coupled devices. A defective pull-up in one inverter is an example of an asymmetric defect.

Manufacturing quality testing procedures are provided to detect such defects in newly manufactured integrated circuits. One test described in U.S. Pat. No. 5,559,745, considered to Banik et al is a "weak write" test, which uses on-die test circuitry to stress each SRAM cell with a pre-designed "weak write" stress that will pass a good cell and fail a cell with significant device or interconnect defects. In this test, data (e.g., a logic level "1") is written to a memory cell, a complement of the data (e.g., a logic level "0") is then weakly written to the memory cell, and the memory cell is then read to determine whether the weak write of the data complement overwrote data written to the memory cell. If the weak write of the data complement overwrote the data written to the memory cell, then the memory cell is deemed defective. If the weak write of the data complement did not overwrite the data written to the memory cell, then a weak write test is repeated on the memory cell using opposite logic levels. For example, opposite data (e.g., a logic level "0") is written to the memory cell, the opposite data complement (e.g., a logic level "1") is then weakly written to the memory cell, and the memory cell is then read to determine whether the weak write of the opposite data complement overwrote the opposite data written to the memory cell. If the weak write of the opposite data complement did overwrite the opposite data written to the memory cell, then the memory cell is deemed defective, and the test may be terminated. Common defects failing weak-write stresses can include missing salicide junctions, internal metal shorts, source/drain dislocations, and light p-tip dose.

The current weak write circuitry is limited, however, because the pre-designed stress point does not adequately track manufacturing process variations and/or manufacturing process modifications. For example, this means that tests using the current weak write circuitry may fail memory cells that should be passed or vice versa because of process variations and/or modifications, which may cause undesirably lower test yields or under-tested parts. Furthermore, the current weak write circuitry cannot evaluate manufacturing process variations/modifications and their effects on the appropriateness of the stress point used to determine whether or not a memory cell is defective.

Even if the prior art weak write circuitry could track and evaluate manufacturing process variations and/or modifications and the evaluation indicated that the stress point needed to be changed, the prior art weak write circuitry cannot change the stress point post-silicon except through use of a small number of environmental factors. This is because each weak write circuit has only one stress point set by pre-silicon design factors. This is troublesome because many pre-silicon and post-silicon factors affect the optimization of the choice of stress point.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

A programmable weak write test mode (PWWTM) circuit and method are described in detail herein. In the following description, numerous specific details, such as particular processes, materials, devices, and so forth, are presented to provide a thorough understanding of embodiments of the invention. One skilled in the relevant art will recognize, however, that the invention can be practiced without one or more of the specific details, or with other methods, components, etc. In other instances, well-known structures or operations are not shown or described in detail to avoid obscuring various embodiments of the invention.

Some parts of the description will be presented using terms such as cell array, bit, word, data, decoder, transistor, line, and pass gate, and so forth. These terms are commonly employed by those skilled in the art to convey the substance of their work to others skilled in the art.

Other parts of the description will be presented in terms of operations performed by a computer system, using terms such as accessing, determining, counting, transmitting, and so forth. As is well understood by those skilled in the art, these quantities and operations take the form of electrical, magnetic, or optical signals capable of being stored, transferred, combined, and otherwise manipulated through mechanical and electrical components of a computer system; and the term "computer system" includes general purpose as well as special purpose data processing machines, systems, and the like, that are standalone, adjunct or embedded.

Various operations will be described as multiple discrete blocks performed in turn in a manner that is most helpful in understanding the invention. However, the order in which they are described should not be construed to imply that these operations are necessarily order dependent or that the operations be performed in the order in which the blocks are presented.

Reference throughout this specification to "one embodiment" or "an embodiment" means that a particular feature, structure, process, block, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
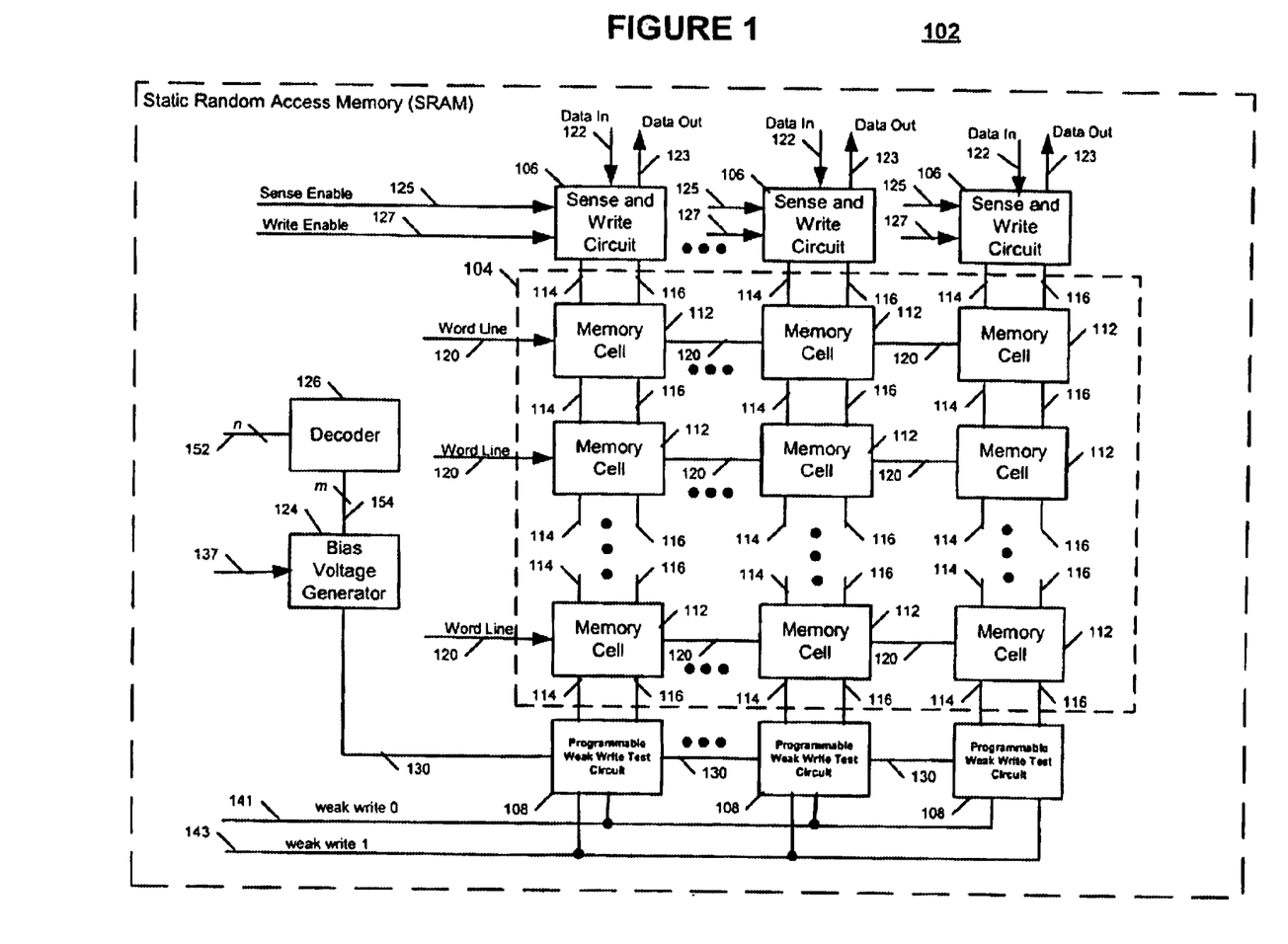
FIG. 1 is a schematic diagram of an example static random access memory (SRAM) according to embodiments of the present invention.

FIG. 1 shows an example embodiment of a static random access memory (SRAM) device 102. The SRAM device 102 commonly forms part of a cache memory. For example, the SRAM device 102 may be a first level cache (L1) and/or a second level cache (L2) of a computer system (shown in FIG. 6). The SRAM device 102 may be internal to a processor and/or an external device. Alternatively, the SRAM device 102 may be associated with any computer system that makes use of an SRAM.

The SRAM device 102 includes a memory cell array 104 coupled to several sense and write circuits 106 and several programmable weak write test circuits 108. A bias voltage generator 124 is coupled to the programmable weak write test circuits 108 and an n:m decoder 126.

The memory cell array 104 includes several memory cells 112. The memory cell array 104 also includes several bit lines 114, several complement bit lines 116, and several word lines 120 coupled to the memory cells 112. The bit lines 114 and 116 are complementary such that when data is written to a memory cell 112 via a bit line 114 the data's complement is written to the memory cell 112 via the complement bit line 116. Each word line 120 corresponds to a row of the memory cell array 104. The word lines 120 determine which memory cell(s) 112 are to be selected for reading and writing.

The sense and write circuits 106 include sense amplifiers (not shown), operational write circuits (not shown), data in lines 122, data out lines 123, sense enable lines 125, and write enable lines 127. Data is written to a memory cell 112 via the data in lines 122 and the sense and write circuits 106. Operational write circuits in the sense and write circuits 106 differentially write data to a memory cell 112 via the bit lines 114 and the complement bit lines 116. The write enable signal 127 enables the operational write circuits. Data is read from a memory cell 112 via the data out lines 123 and the sense and write circuits 106. Sense amplifiers in the sense and write circuits 106 differentially sense data on the bit lines 114 and the complement bit lines 116 during read operations. The sense enable signal 125 enables the sense amplifiers. Circuits suitable for implementing the sense and write circuits 106 are well known.

Register bits control an n-bit input 152 to the decoder 126, which translates the n-bit input 152 to an m-bit output 154. In one embodiment, the decoder 126 is a three-to-eight decoder. Of course, the number of bits for n and/or m can be more or fewer than three and/or eight, respectively, depending on the particular implementation of the programmable weak write test.

The m-bit output 154 is coupled to the input of the bias voltage generator 126, which generates a voltage on the bias voltage line 130. The voltage on the bias voltage line 130 has up to m different values, which are coupled to the programmable weak write test circuits 108. The programmable weak write test circuits 108 also are coupled to a weak write 0 line 141 and a weak write 1 line 143.

The programmable weak write test circuits 108 receive a bias voltage enable signal on a bias voltage enable signal line 137, which places the SRAM device 102 into programmable weak write test mode. When enabled, the programmable weak write test circuits 108 perform weak writes to the memory cells 112 at a given stress strength and polarity. The level of the voltage on the bias voltage line 130 determines the strength of the weak write stress. The logic levels on the weak write 0 line 141 and the weak write 1 line 143 determine the polarity of the weak write stress.

In one embodiment of the present invention, the voltage on the bias voltage line 130 modulates the strength of the weak write stress between 0.25 volts and 0.55 volts. Of course, other bias voltages and weak write stress strengths may be used. In embodiments of the present invention, the SRAM device 102 can implement a post-silicon method to significantly change the stress function as needed (e.g., following a process change, a design or process modeling error, or when the defect population versus degree of stress is to be determined, or to empirically tune the stress to an acceptable defect population, or for other systematic applications).

Although FIG. 1 shows the memory cell array 104 as having nine memory cells 112, memory cell arrays commonly have a much larger number of memory cells (e.g., thousands of cells) all lined up in one or more rows and/or columns and sharing the same bit lines. Decoders suitable for implementing the decoder 126 are well known.

Figure 2:
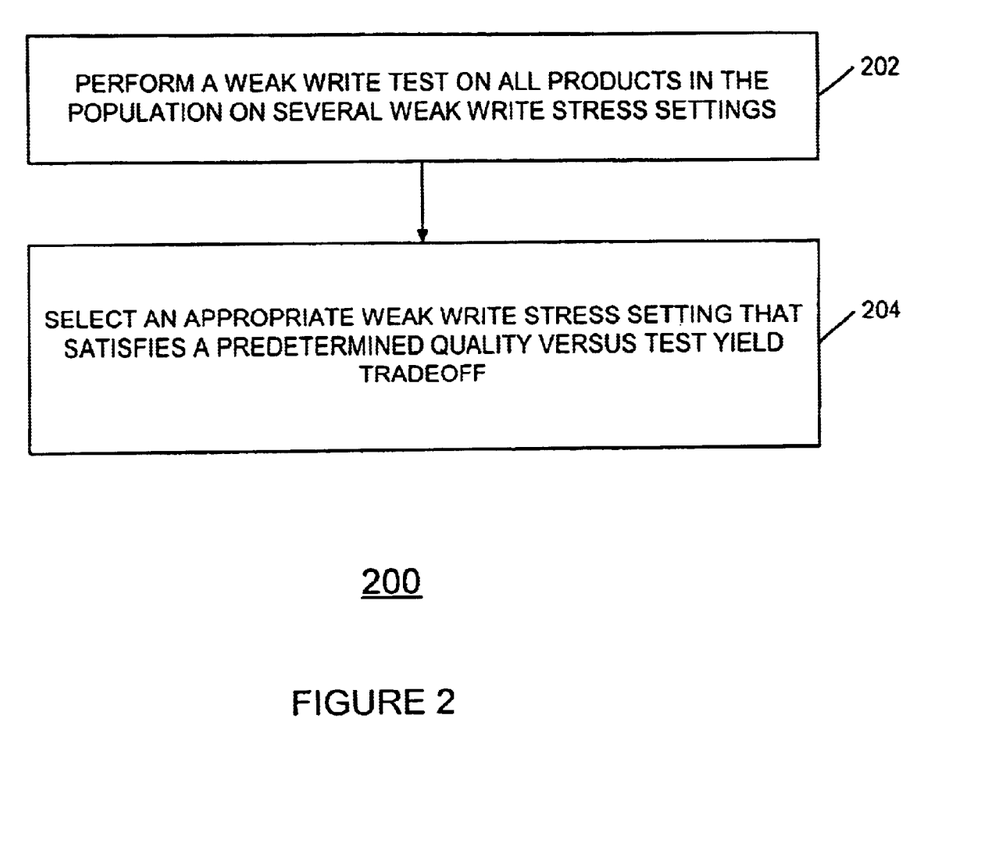
FIG. 2 is a flowchart of an approach to weak write testing according to an embodiment of the present invention.

FIG. 2 is a flowchart of an example method 200 for characterizing behavior of a population of SRAM devices according to embodiments of the present invention. A machine-readable medium with machine-readable instructions thereon may be used to cause one or more processors to perform the process 200. Of course, the process 200 is only an example process and other processes may be used to characterize behavior of a population of SRAM devices according to embodiments of the present invention.

A block 202 performs a weak write test on all products in a selected population on several weak write stress settings. For example, each SRAM device 102 is tested at every weak write stress strength and polarity available from the weak write test circuitry.

A block 204 selects an appropriate weak write stress setting that satisfies an acceptable or predetermined quality versus test yield tradeoff.

In an alternative embodiment, a stress point may be chosen pre-silicon, based on pre-silicon design and environmental factors, for example. Then, the process 200 is performed post-silicon to verify the stress point selected pre-silicon or to determine a new stress point, if the pre-silicon stress point is inappropriate.

Figure 3:
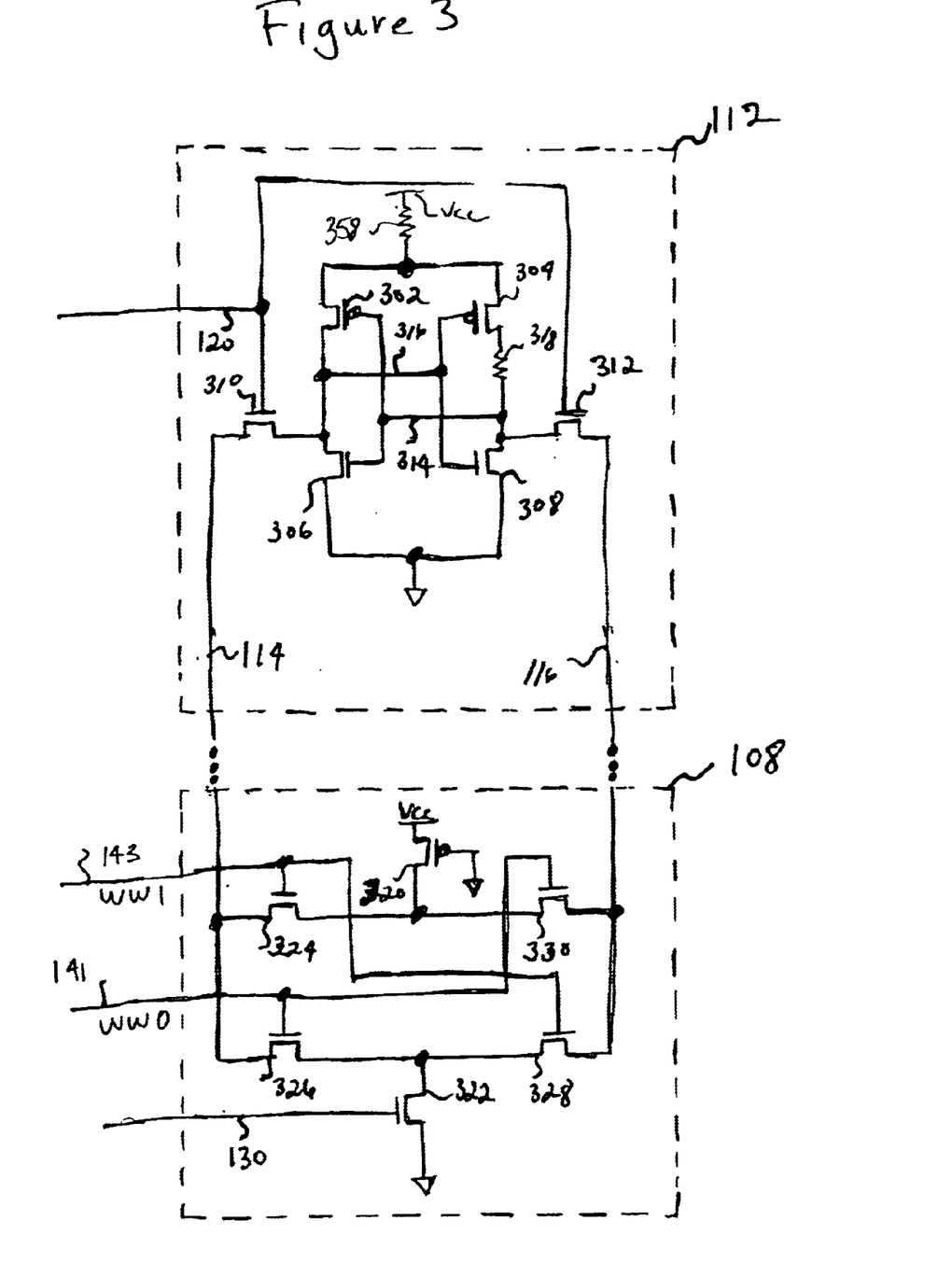
FIG. 3 is a schematic diagram of the example memory cell and the example programmable weak write test circuit depicted in FIG. 1 according to embodiments of the present invention.

FIG. 3 is a schematic diagram of an example embodiment of one of the memory cells 112 and one of the programmable weak write test circuits 108. The memory cell 112 includes transistors 302 and 306, which form an inverter, coupled to transistors 304 and 308, which form a second inverter. The memory cell 112 also includes pass devices 310 and 312, a weak node 314, a strong node 316, a resistance 318, which represents an example asymmetrical defect in the memory cell 112, and a resistance 358, which represents a example symmetrical defect in the memory cell 112. Of course, the symmetrical and asymmetrical defects need not be as depicted in FIG. 3. For example, defects may be located in different places within the memory cell 112. Common asymmetrical and/or symmetrical defects include missing salicide junctions, internal metal shorts, source/drain dislocations, and a light p-tip dose.

The programmable weak write test circuit 108 includes transistors 320 and 322, and pass devices 324, 326, 328, and 330. The weak write 1 line 143 couples a weak write signal to the gates of the pass devices 324 and 328. The weak write 0 line 141 couples a complementary weak write signal to the gates of the pass devices 326 and 330. The memory cell 112 is coupled to the programmable weak write test circuit 108 via the bit lines 114 and 116. The programmable voltage on the bias voltage line 130 is applied to the gate of the transistor 322.

Initially, the memory cell 112 is set to a data level. When the weak write test is enabled, the voltage on the bias voltage line 130 turns on the transistor 322. When the weak write 1 line 143 goes active, the transistor 322 starts pulling down on the complement bit line 116 through the transistor 328, and the transistor 320 prevents the bit line 114 from falling below a voltage level equal to $V_{CC}$ minus the threshold voltage of 324 ($V_{CC}-V_{TN324}$). Alternatively, when the weak write 0 line 141 goes active, the transistor 322 starts pulling down on the bit line 114 through the transistor 326 and the transistor 320 prevents the complement bit line 116 from falling below a voltage level equal to $V_{CC}$ minus the threshold voltage of 330 ($V_{CC}-V_{TN330}$). The strength of the weak write test mode stress is set by the strength of transistor 322, which is determined by the voltage level present on the bias voltage line 130. The data on the weak write 0 line 141 and the weak write 1 line 143 determines whether the bias transistor 322 pulls down the bit line 114 or the complement bit line 116 through 326 or 328, respectively.

The memory cell 112 is read following the weak write stress event. If the significance of the defects 318 and/or 358 is relatively small, the data stored in the memory cell 112 does not change during the weak write stress event. If the significance of the defects 318 and/or 358 is relatively large, the weak write data is written to the memory cell 112 during the weak write stress event. In the embodiments shown herein, the n-channel transistor 322 dominates the ability to detect defects. As such, the embodiments herein show bias voltage options for the transistor 322 and not for the transistor 320. Note that the transistor 320 is grounded and not programmable.

Figure 4:
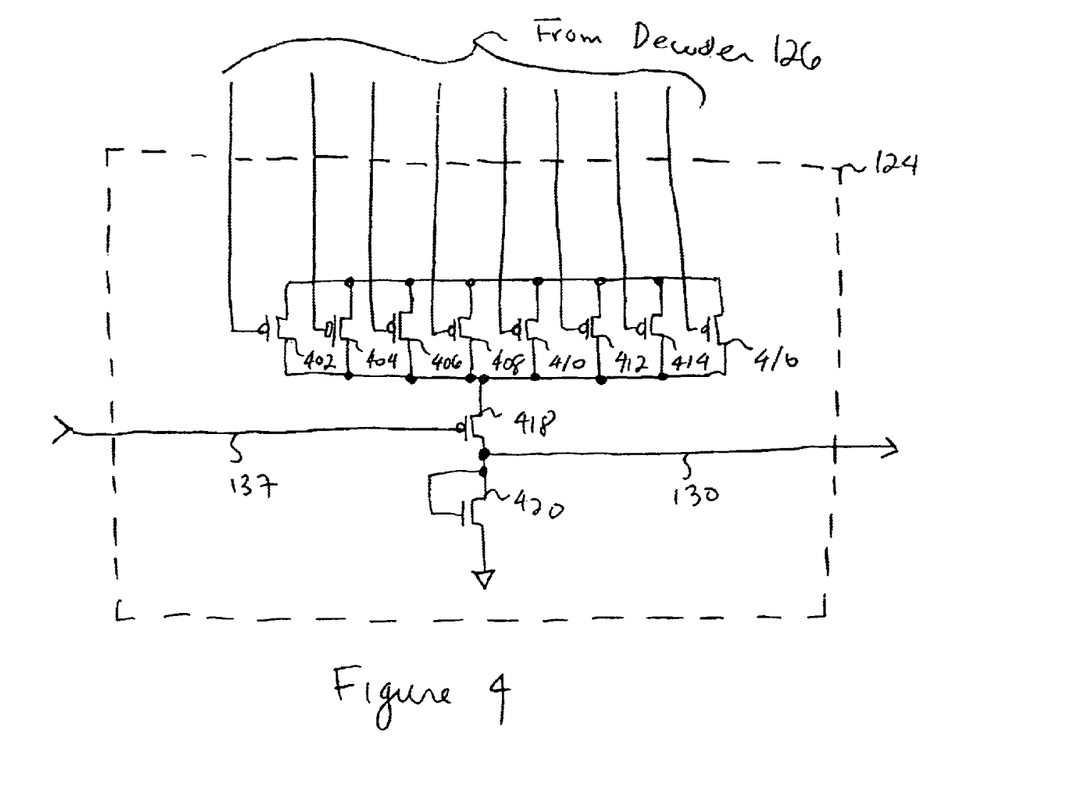
FIG. 4 is a schematic diagram of the example bias voltage generator depicted in FIG. 1 according to embodiments of the present invention.

There are various ways to implement the bias voltage generator 124. For example, one embodiment of the bias voltage generator 124 is illustrated in FIG. 4, which includes several p-channel transistors 402, 404, 406, 408, 410, 412, 414, and 416. The bias voltage generator 124 also includes an enabling transistor 418, an n-channel transistor 420, the bias generator enable signal line 137 to receive the bias generator enable signal, and the bias voltage line 130.

Each p-channel transistor 402, 404, 406, 408, 410, 412, 414, and 416 is a different size chosen to obtain a particular resistance detection for the particular defect for which the memory cell 112 is being tested. The transistors 402, 404, 406, 408, 410, 412, 414, and 416 help modulate the voltage on the bias voltage line 130 depending on the size of the transistor and the values feeding their gates from the decoder 126. In the embodiment shown in FIG. 4, because there are at least eight different transistor 402, 404, 406, 408, 410, 412, 414, and 416, there are at least eight different values for the voltage on the bias voltage line 130. Of course, more or less than eight different values for the voltage on the bias voltage line 130 are possible and after reading the description herein a person of ordinary skill in the relevant arts will be able to implement the present invention for more or less than eight different values for the voltage on the bias voltage line 130.

Activating the bias voltage enable signal line 137 shuts off any direct current (DC) current path between $V_{CC}$ and ground within the bias voltage generator 124.

The example bias voltage generator 124 may be a process-tracking bias voltage generator. In one embodiment, the transistor 420 may allow for better tracking with process skew. For example, when the process skew speeds up, the transistor 420 pulls down stronger and the resulting value for the voltage on the bias voltage line 130 is lower. The transistor 420 may be an instantiation of several small devices and is matched to the transistor 322 to allow for better tracking across process skew corners.

Figure 5:
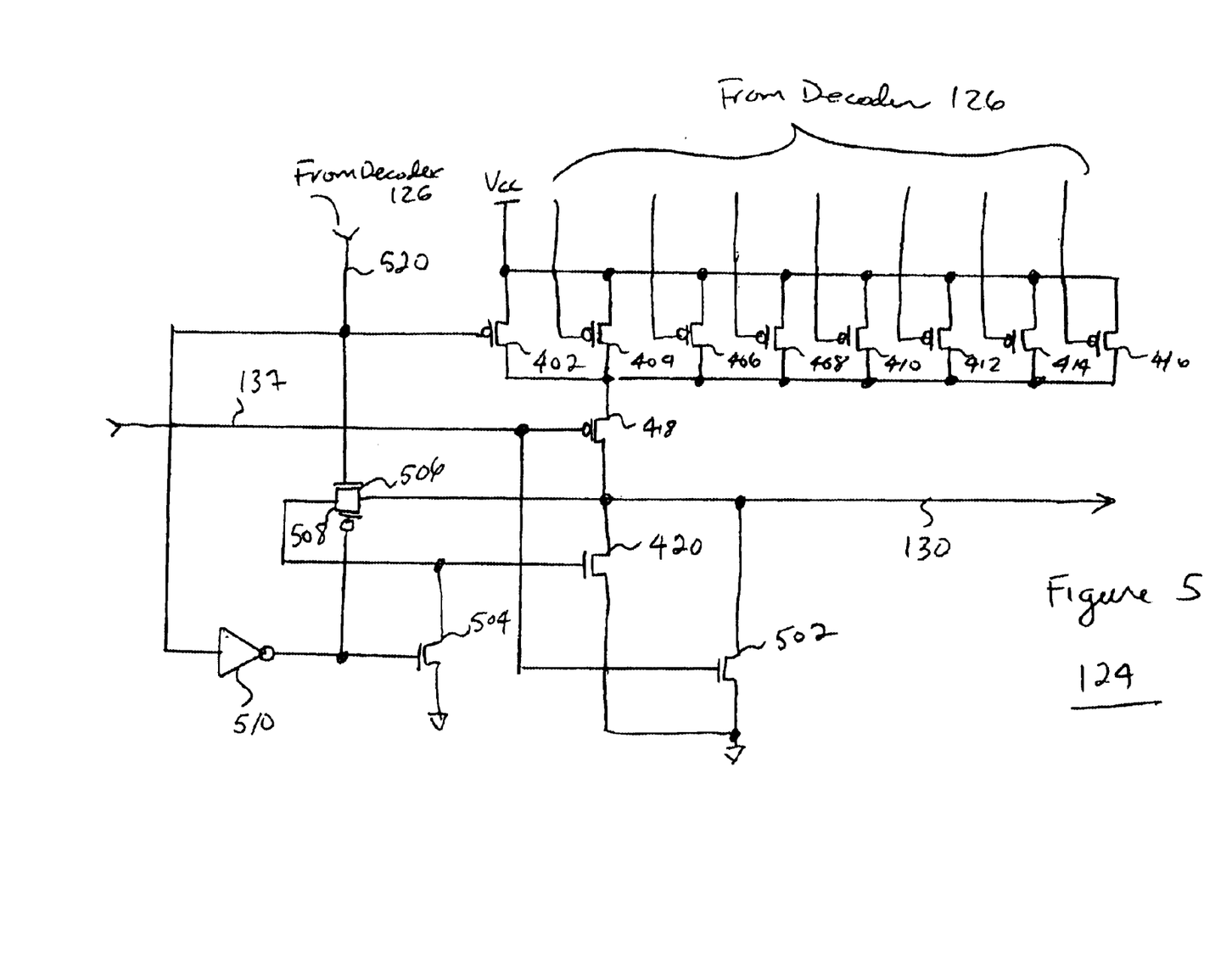
FIG. 5 is a schematic diagram of the example bias voltage generator depicted in FIG. 1 according to alternative embodiments of the present invention.

An alternative embodiment of the bias voltage generator 124 is illustrated in FIG. 5, which may be used to enable a "$V_{CC}$" mode. When the $V_{CC}$ mode is enabled the voltage on the bias voltage line 130 will equal $V_{CC}$. The $V_{CC}$ mode may be useful to ensure that the programmable weak write test is functioning properly during feature testing by product engineers. For example, the $V_{CC}$ mode guarantees that the cell will "fail" or be flipped during the weak write stress.

In one embodiment of the present invention to implement the VCC mode, the decoder 126 is a 3:8 decoder, the binary logic value of the decoder inputs is set "111," the signal on the bias voltage enable signal line 137 is low (active), and a signal line 520 is low (active). Under these conditions, transistor 418 is on and the transistor 420 is off. The transistor 402 is on, a transistor 502 is off, and a transistor 504 is on because the output of an inverter 510 is high. The transistor 506 is off and the transistor 508 is off. This condition allows the transistor 402 to pull the voltage on the bias voltage line 130 to $V_{CC}$ through the transistor 418. When the voltage on the bias voltage line 130 reaches $V_{CC}$ the weak write strength is strong enough to overwrite the logic state stored in the memory cell 112.

In an alternative embodiment of the present invention, an optional transistor 502 may be used to force the voltage on the bias voltage line 130 to "zero" (or $V_{SS}$) when weak write testing is disabled. This feature prevents the voltage on the bias voltage line 130 from floating and could help prevent potential leakage conditions.

Of course FIGS. 4 and 5 are examples and other embodiments of the bias voltage generator 124 are possible. After reading the description herein, persons of ordinary skill in the art will readily recognize how to implement other embodiments of the bias voltage generator 124.

Figure 6:
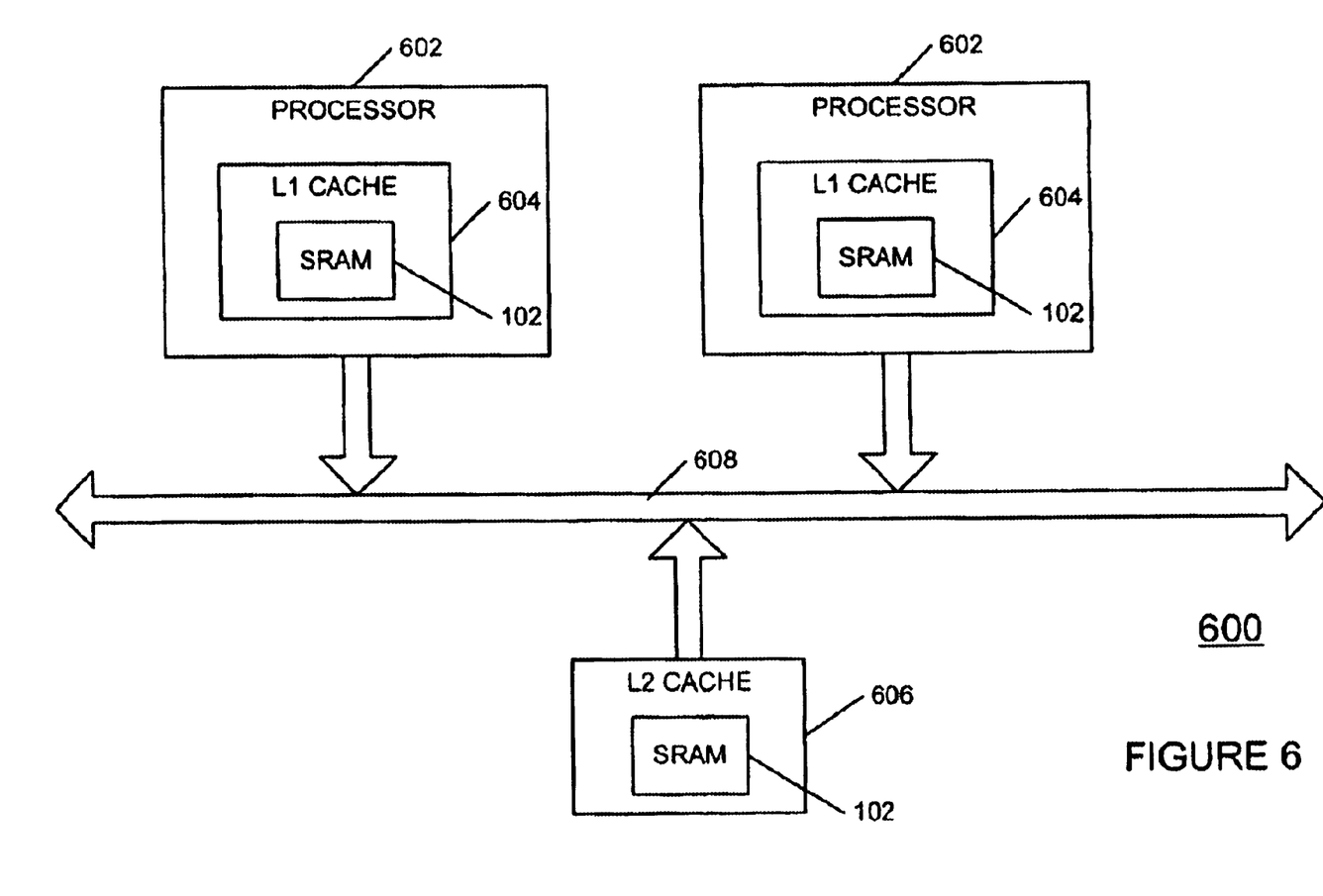
FIG. 6 is a high-level block diagram of a computer system according to embodiments of the present invention.

FIG. 6 is a block diagram of an example computer system 600 suitable for implementing embodiments of the present invention. The computer system 600 includes several devices coupled to each other via several buses. For example, the computer system 600 includes several processors 602, which performs their conventional functions of executing programming instructions including implementing many of the teachings of the present invention. The processors 602 may be coupled to several first level caches (L1 caches 604) and one or more second level caches (L2 cache 606) via a bus 608. According to the embodiment shown in FIG. 6, the L1 cache 604 and/or the L2 cache 606 include one or more SRAM devices 102, which are implemented according to embodiments of the present invention.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
   a static random access memory having at least one memory cell and a programmable weak write test circuit coupled to at least one memory cell, a bias voltage generator coupled to the programmable weak write test circuitry, and an n:m decoder coupled to the bias voltage generator.

2. The apparatus of claim 1 wherein the bias voltage generator is coupled to provide at least two bias voltages to program the programmable weak write test circuit.

3. The apparatus of claim 2 wherein the decoder is coupled to program the bias voltage generator to provide the bias voltages.

4. The apparatus of claim 1, further comprising at least one sense and write circuit coupled to the memory cell via at least one bit line.

5. The apparatus of claim 4, further comprising at least one data line coupled to provide data to the sense and write circuit.

6. The apparatus circuit of claim 1, further comprising at least one word line coupled to the memory cell to select the memory cell.

7. A system, comprising:
at least one processor; and
at least one static random access memory having at least one memory cell and programmable weak write test circuitry coupled to at least one memory cell,
wherein the programmable weak write test circuitry comprises a bias voltage generator coupled to a programmable weak write test circuit, wherein the bias voltage generator is coupled to provide at least two bias voltages to the programmable weak write test circuit.

8. The system of claim 7 wherein the programmable weak write test circuit further comprises a decoder coupled to program the bias voltage generator to provide the bias voltages.

9. The system of claim 7, further comprising at least one data line coupled to provide data to the memory cell via the sense and write circuit.

10. The system of claim 7, further comprising at least one word line coupled to the memory cell to select the memory cell.

11. A method, comprising:
performing a weak write test on a population of static random access memory (SRAM) using all weak write stress settings available from weak write test circuitry; and
selecting an appropriate weak write stress setting in accordance with a predetermined quality versus test yield tradeoff.

12. The method of claim 11 wherein performing a weak write test on a population of static random access memory (SRAM) using all weak write stress settings available from weak write test circuitry comprises for each SRAM:
writing a first data to the memory cell, weak writing a first data complement to the memory cell at a first weak write strength, and verifying the memory cell;
writing a second data to the memory cell, weak writing a second data complement to the memory cell at the first weak write strength, and verifying the memory cell;
writing the first data to the memory cell, weak writing the first data complement to the memory cell at a second set of weak write strengths, and verifying the memory cell;
writing the second data to the memory cell, weak writing the second data complement to the memory cell at the second set of weak write strengths, and verifying the memory cell.

13. The method of claim 12 wherein the first data comprises a logic level "0" and the first data complement comprises a logic level "1."

14. The method of claim 11, wherein the second data comprises a logic level "1" and the second data complement comprises a logic level "0."

15. An apparatus, comprising:
a static random access memory having at least one memory cell and a programmable weak write test circuit coupled to at least one memory cell, a bias voltage generator coupled to the programmable weak write test circuitry, and a decoder coupled to the bias voltage generator.

16. The apparatus of claim 15 wherein the decoder includes three inputs and eight outputs.

17. The apparatus of claim 16 wherein eight inputs of the bias voltage generator are coupled to the eight outputs of the decoder and an output of the bias voltage generator is coupled to provide eight different bias voltages to the programmable weak write test circuit corresponding to inputs on the three decoder inputs.

18. The apparatus of claim 16 wherein at least one of the two bias voltages is $V_{CC}$.

19. The apparatus of claim 16 wherein at least one of the two bias voltages is less than $V_{CC}$.

20. The apparatus of claim 19 wherein at least one of the two bias voltages is $V_{SS}$.

21. The apparatus of claim 15, further comprising at least one sense and write circuit coupled to the memory cell via at least one bit line.

22. The apparatus of claim 15 wherein the bias voltage generator is coupled to provide at least two bias voltages to program the programmable weak write test circuit.

23. A method, comprising:
testing weak write test circuitry on a population of static random access memory (SRAM) devices by writing a first data to a memory cell, weak writing a first data complement to the memory cell at a first weak write strength equal to $V_{CC}$, verifying the memory cell, writing a second data to the memory cell, weak writing a second data complement to the memory cell at the first weak write strength equal to $V_{SS}$, and verifying the memory cell;
performing a weak write test on the population of SRAM devices using all weak write stress settings available from weak write test circuitry; and
selecting an appropriate weak write stress setting in accordance with a predetermined quality versus test yield tradeoff.

24. The method of claim 23 wherein the first data comprises a logic level "0."

25. The method of claim 24, wherein the second data comprises a logic level "1."

26. A system, comprising:
at least one processor;
at least one static random access memory having at least one memory cell and programmable weak write test circuitry coupled to at least one memory cell; and
at least one sense and write circuit coupled to the memory cell via bit lines to write to and read from the memory cell.

* * * * *